US005543786A

United States Patent [19]
Wu

[11] Patent Number: 5,543,786
[45] Date of Patent: Aug. 6, 1996

[54] KEYBOARD SCANNING CIRCUIT

[75] Inventor: Chyi-Chang Wu, Hsinchu, Taiwan

[73] Assignee: United Microelectronics Corp., Hsinchu, Taiwan

[21] Appl. No.: 324,803

[22] Filed: Oct. 18, 1994

[51] Int. Cl.⁶ .................................................. H03K 17/94
[52] U.S. Cl. ............................ 341/22; 341/26; 379/368; 364/709.12
[58] Field of Search .............................. 341/25, 26, 27, 341/23, 22, 24; 364/709.12, 709.15, 709.16, 709.14; 379/368

[56] References Cited

U.S. PATENT DOCUMENTS

| | | | |
|---|---|---|---|
| 4,498,073 | 2/1985 | Fisher et al. | 341/709.12 |
| 4,617,554 | 10/1986 | Krause et al. | 341/26 |
| 4,758,829 | 7/1988 | Smith III | 341/26 |
| 4,825,464 | 4/1989 | Wen | 379/368 |
| 5,220,601 | 6/1993 | Gulick et al. | 379/368 |
| 5,235,331 | 8/1993 | Sato | 341/26 |
| 5,235,635 | 8/1993 | Gulick | 379/368 |
| 5,274,371 | 12/1993 | Yang et al. | 341/26 |
| 5,285,495 | 2/1994 | Wu et al. | 341/26 |
| 5,381,142 | 1/1995 | Simmons, Jr. | 341/26 |
| 5,463,386 | 10/1995 | Wu | 341/26 |

*Primary Examiner*—John K. Peng
*Assistant Examiner*—Timothy Edwards, Jr.
*Attorney, Agent, or Firm*—Ladas & Parry

[57] ABSTRACT

A keyboard scanning circuit for detecting additional user selected functions on a keyboard while the keyboard is being "debounced". The scanning circuit permits the scanning for additional functions without the need for additional scanning ports by detecting whether a row port of the scanning circuit is connected to a source voltage via a resistor, a ground via a resistor, or is floating. The user or the manufacturer using the circuit can set the switches which establish the status of these additional functions.

5 Claims, 4 Drawing Sheets

KEYBOARD SCANNING CIRCUIT

FIELD OF THE INVENTION

The present invention relates to a keyboard scanning circuit, and especially to a keyboard scanning circuit for an integrated circuit providing additional function selections without increasing the number of input/output (I/O) ports of the integrated circuit.

BACKGROUND OF THE INVENTION

The specification of each country's telephone communication system is somewhat different. As listed in Table 1, a worldwide telephone equipment manufacture may have to meet many different possible specifications in his products, e.g., a telephone. Usually, this problem is solved by adding additional I/O ports in the scanning circuits to detect additional functions that can be selected by a user of the telephone. As done in the prior art, each selection in Table 1 requires an additional I/O port which is tested to determine the state (i.e. selected or not selected) of each selection in Table 1. However, since the scanning circuits are often embodied in Integrated Circuits (ICs), the cost of the scanning circuits is primarily dependent upon the cost of the Integrated Circuits in which they are built. Generally speaking, packaging is the most expensive process among the processes involved in producing an IC. As listed in Table 2, the number of pins of an IC directly affects its cost. ICs with more pins are more expensive. Therefore, manufacturers try to reduce the number of I/O ports needed in a scanning circuit, to reduce the number of pins used by the IC in which it is embodied.

TABLE 1

| item | spec. |
|---|---|
| dial rate select | 10 PPS or 20 PPS |
| make/break ratio | 1:2 or 2:3 |
| pause | 2 sec. to 4 sec. |
| flash | 80 ms to 600 ms |
| dialing pulse | normal or n + 1 or 10 − n |

TABLE 2

| pin | packaging cost (cent) |
|---|---|
| 16 | 10.4 |
| 18 | 13.2 |
| 20 | 17.2 |
| 22 | 21.6 |

A conventional keyboard for a telephone is shown in FIG. 1a. The keyboard has twelve input keys arranged in four rows by three columns. A basic keyboard scanning circuit for the keyboard is shown in FIG. 1b, where only one row port R1 and one column port C1 are shown for purposes of simplifying this example. Four clocks S1 to S4, shown in FIG. 1c, are used to drive the circuit. A common circuit for generating the clocks S1 to S4 is shown in FIG. 1d. At the beginning of a scanning cycle, S1 is at a high level, row port R1 is set to a high level with high impedance, and column port C1 is set to a low level with low impedance. If there is a key pressed down in row 1, then row port R1 assumes a low level. When clock S2 is at a high level, the status of the row port R1 is latched in latch 10A. When clock S3 goes to a high level, column port C1 is set to a high level with high impedance and row port R1 is set to a low level with low impedance. If the pressed key is on column 1, then column port C1 will assume a low level. When clock S4 is at a high level, the status of the column port C1 is stored in latch 10B. The scanning procedure described above repeats endlessly. By monitoring the status of the row ports and column ports, as stored in the latches, a determination can be easily made whether there is a key pressed and, if so, which key is pressed. The conventional keyboard scanning circuit scans the input keys of the keyboard; however, if detection of other selections is desired, e.g., selections listed in Table 1, additional scanning ports (I/O ports) are required. Thus, the cost of the conventional additional I/O ports.

SUMMARY OF THE INVENTION

The object of the present invention is to provide a keyboard scanning circuit which is capable of scanning additional function selections without the need for additional scanning ports.

Since the input keys of a keyboard have mechanical contacts, bouncing noise occurs at the beginning of contact. Accordingly, detection of a pressed key begins after the pressed key has made a steady contact and the keys must be tested for a period of time( usually several tens of milliseconds). The short period of time during which the keys are "de-bounced" prior to detection is used by the keyboard scanning circuit of the present invention to detect additional function selections. For example, the scanning ports may be allowed to float or may be connected to either a source voltage or ground via an external resistor, to represent different selections. According to the present invention, a circuit is incorporated into the conventional scanning circuit to detect whether the scanning ports have been allowed to float or are connected to a source voltage or to ground. The foregoing detection occurs while the keys are being debounced. The improved keyboard scanning circuit thus permits additional function selections to be detected without the need for additional scanning ports.

The above objects are fulfilled by providing a keyboard scanning circuit for detecting pressed keys and additional functions on a keyboard. The circuit preferably comprises: (1) a clock generator for generating driving clocks and a signal SKIP after a key is pressed; (2) at least one row I/O port connected to said keys on said keyboard; (3) at least one column I/O port connected to said keys on said keyboard; (4) a key scanning circuit for scanning said pressed keys which can be disabled by the signal SKIP; (5) at least one external resistor connected to a source voltage; (6) at least one external resistor connected to a ground; (7) at least one switch capable of being set to connect the row port with one of said resistors or a float point which represent said functions; (8) at least one external resistor detecting circuit for connecting the row port to the source voltage or the ground at different clocks when the signal SKIP is at a high level; and (9) a plurality of memory devices for storing the status of the row port and the column port.

BRIEF DESCRIPTION OF THE DRAWING

The present invention will become more fully understood from the detailed description given hereinafter with reference to the accompanying drawings which are given by way of illustration only, and thus are not limitative of the present invention and wherein:

FIG. 2b shows clocks used in the circuit shown in FIG. 2a;

FIG. 2c shows the circuit diagram for generating the signal SKIP used in the circuit shown in FIG. 2a.

DETAILED DESCRIPTION OF THE PREFERRED EMBODIMENT

Figures 1A, 1B:
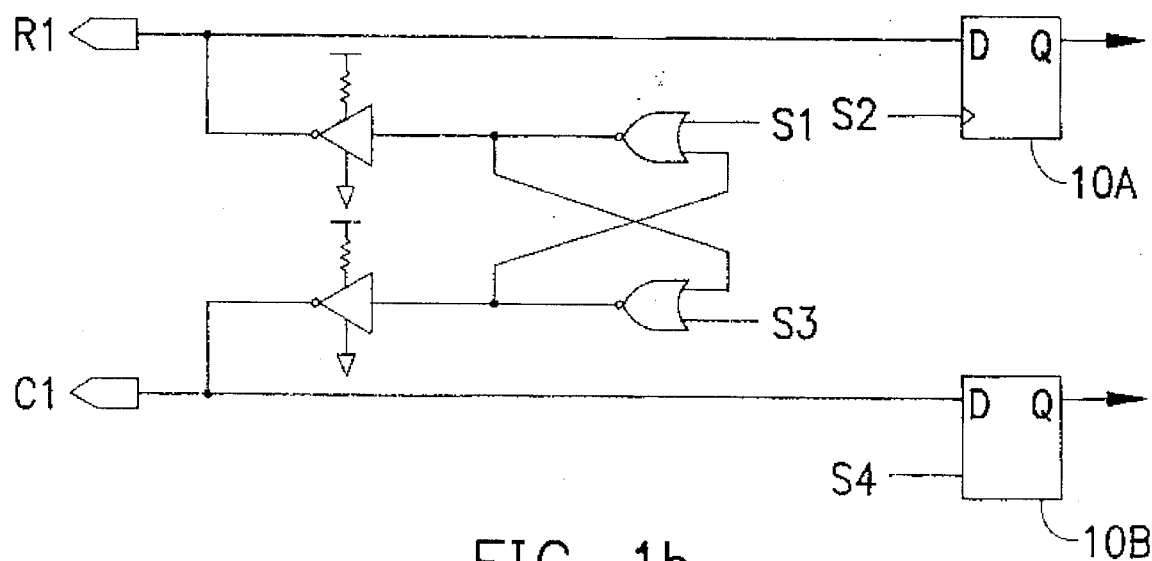
FIG. 1a shows a four row by three column (4×3) keyboard.
FIG. 1b is a circuit diagram showing a conventional keyboard scanning circuit.
Figure 1C:
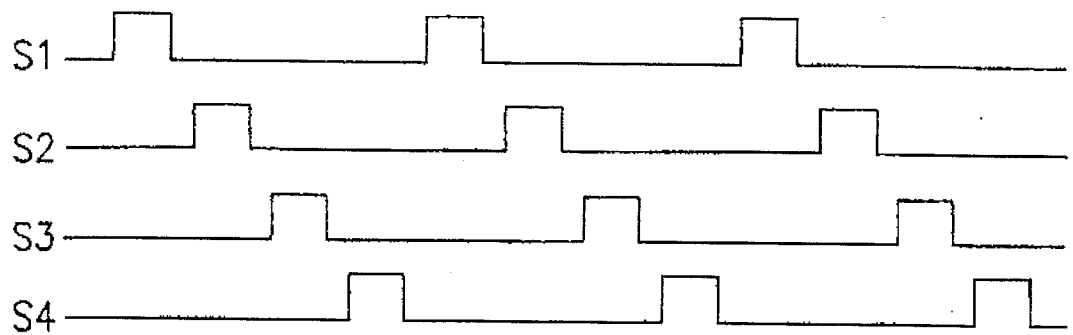
FIG. 1c shows clocks used in the circuit shown in FIG. 1b.
Figure 1D:
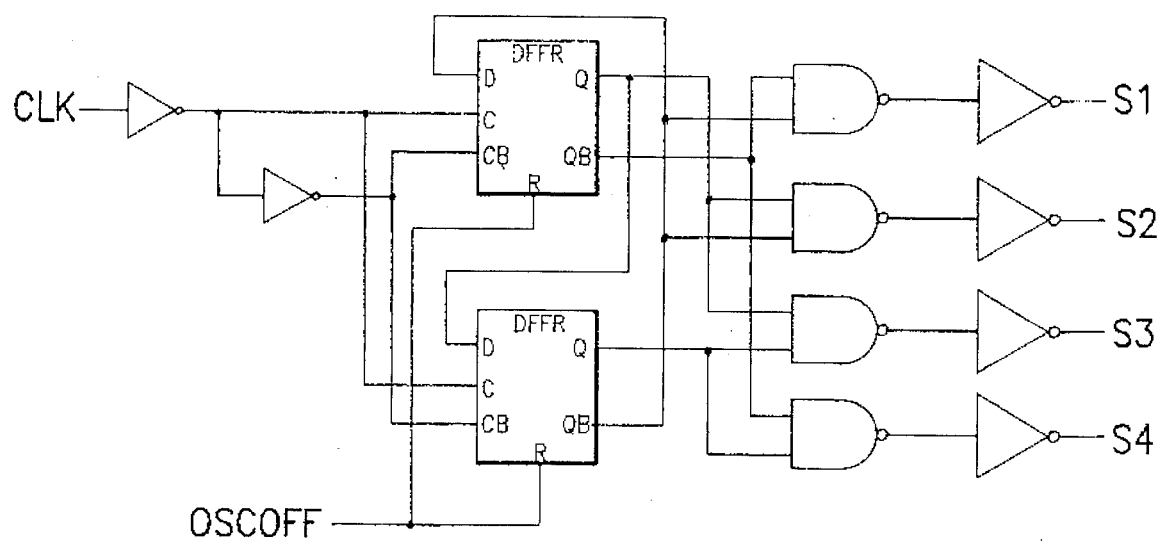
FIG. 1d shows the circuit diagram for generating the clocks shown in FIG. 1c.
Figure 2A:
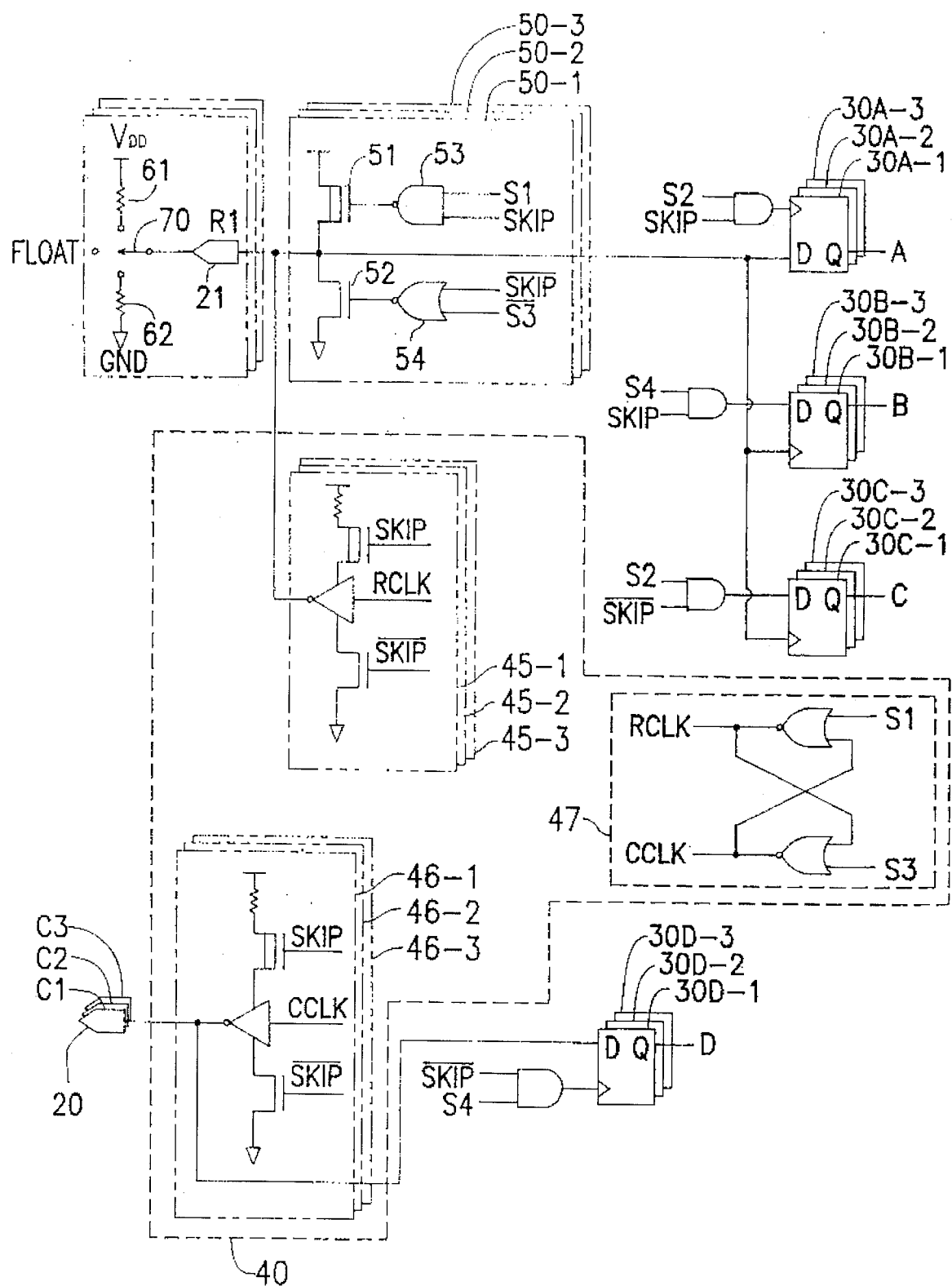
FIG. 2a shows the circuit diagram of the keyboard circuit according to the present invention.
Figure 2B:
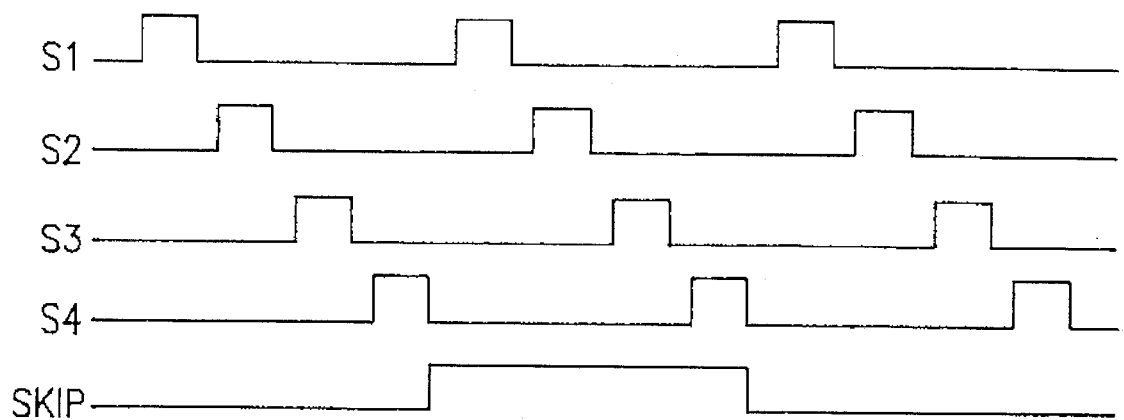
Figure 2C:
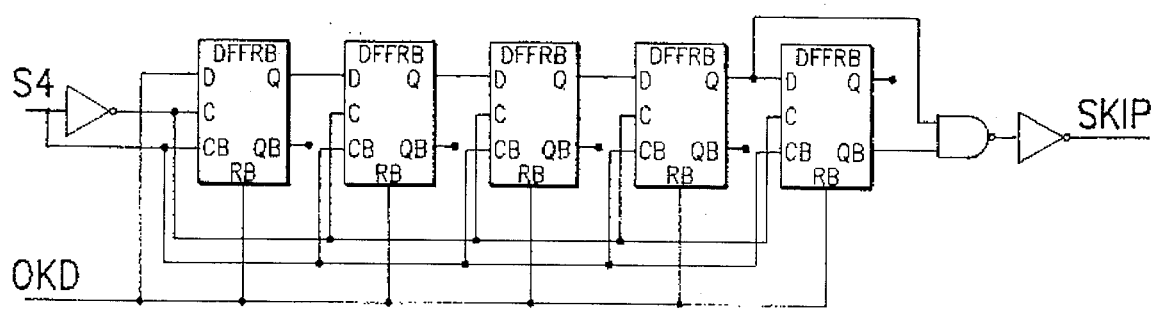

A preferred embodiment of the present invention is shown in FIG. 2a. The scanning circuit includes a clock generator as shown in FIG. 1d which generates clocks S1, S2, S3 and S4, a signal generator (shown in FIG. 2c) for generating the signal SKIP, at least one row I/O port 21 (one row R1 is shown in detail, but typically the circuit could be connected to a plurality of rows), and at least one column I/O port 20 (one column C1 is shown in detail, but typically the circuit could be connected to a plurality of columns). A key scanning circuit 40 is provided. External resistors (two resistors 61 and 62 are shown in this embodiment), at least one switch 70, external resistor detecting circuits 50 (one circuit 50-1 is shown in detail, while other external resistor detecting circuits 50-2, 50-3, . . . , would normally be used), and a plurality of memory devices, 30A to 30D, are also utilized. In this embodiment, the external resistor detecting circuit 50-1 is used to detect the connection between the row port 21 and the external resistors 61, 62. However, external resistors cannot be connected to row ports and column ports at the same time since the circuitry cannot operate with both row ports and column ports having external resistors connected, otherwise the key scanning circuit 40 will malfunction. As may be readily appreciated, additional rows and columns may be provided by external resistor detecting circuits 50-1, 50-2, 50-3, etc.

Memory devices 30A to 30D comprise latches, for storing the detected status of the row port 21 and column port 20. The entire circuit is driven by clocks S1–S4 shown in FIG. 2b, which are generated by the aforementioned clock generator. If any key is pressed down, referring to FIG. 2c, a signal OKD goes to a high level and the signal generator generates a signal SKIP which lasts a scanning cycle from S1 to S4.

The key scanning circuit 40 includes a flip-flop 47 and circuits 45 and 46. Flip-flop 47 alternatively outputs signals RCLK and CCLK as a high-level signal in accordance with the clock signals S1 and S3. Both circuits 45 and 46 are the same and function as switches. When the SKIP signal is at a low level, the RCLK and CCLK signals are normally output as part of the normal keyboard scanning function and the key scanning circuit 40 performs keyboard scanning like a conventional scanning circuit. When, however, the SKIP signal is at a high level, the RCLK and CCLK signals are grounded and the key scanning circuit 40 is disabled, i.e., the output of the circuit is not sent to the row port and column port.

The external resistor 61 is serially connected to a source voltage and the external resistor 62 is connected to ground. The row port 21 is connected to one of the resistors or floating via switch 70, which may be manually or electrically set.

The external resistor detecting circuit 50 includes a P type metal-oxide-semiconductor (PMOS) transistor 51 coupled between the source voltage and the row port 21, an N type metal-oxide-semiconductor (NMOS) transistor 52 coupled between the ground and the row port 21, a NAND gate 53 connected to clock S1 and signal SKIP to drive the PMOS transistor 51, and a NOR gate 54 connected to inverted clock S3 and an inverted signal SKIP to drive the NMOS transistor 52. When signal SKIP is at a low level, the external resistor detecting circuit 50 is disabled. When signal SKIP is at a high level, if S1 is high, then row port 21 is connected to the source voltage; or if S3 is high, then row port 21 will be connected to the ground.

During the operation of the scanning circuit, when a key is pressed down, the circuit is disabled and waits for the bouncing noise to decay, i.e. for the key to debounce. In the mean time, the signal generator generates the signal SKIP for a scanning cycle from S1 to S4. It should be noted that the signal SKIP may be generated at any scanning cycle within the debouncing period because the SKIP signal is generated from the S4 and OKD signals. Since the OKD signal is high when a key is depressed and thus within the debouncing period, the SKIP signal can be generated. When the signal SKIP is high, the normal key scanning by circuit 40 is disabled, as stated above, and the ports are tested for the presence/nonpresence of external resistors 61, 62. During the signal SKIP cycle, when S1 is high, the row port 21 is connected to the source voltage and goes to a high level. When S2 is high, S1 goes low, and the status of the row port 21 is stored in the memory device 30A. If row port 21 is connected to resistor 61 or is floating, the status will be high. If row port 21 is connected to resistor 62, the status will be low. When S3 goes high, the row port 21 is connected to the ground and goes to a low level. When S4 is high, S3 is low, and the status of the row port 21 is stored in memory device 30B. If row port 21 is connected to resistor 61, the status will be high. If row port 21 is connected to resistor 62 or is floating, the status will be low. Therefore, by checking the output of the memory devices 30A and 30B, the connection of the row port 21 and the external resistors can be determined. That is, additional functions can be set by selecting the connection or non-connection of external resistors 61, 62, and that state of connection/non-connection can be detected without the need for additional row I/O ports or column I/O ports. After the bouncing noise ends, the key scanning circuit 40 begins normal scanning to detection which key has been depressed as described above, and the result is stored in memory devices 30C and 30D.

The number of row ports and column ports utilized is a matter of design choice (since that depends on the numbers of rows and column in the keypad) and the number of rows and columns can be adjusted and easily incorporated into the circuit. In the foregoing example, each row port provides the opportunity for providing three additional functions which may be selected by the user (either the end user of the equipment or the manufacturer of the equipment which contains the keypad). Accordingly, the keyboard scanning circuit of the present invention provides additional function selections, without an increase in the number of I/O ports (i.e., increase in the number of pins), which reduces the cost of the resulting integrated circuit. It should be also noted that the external resistors should have relative high impedances, to avoid conflicts with the key scanning circuit.

While the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A keyboard scanning circuit for detecting pressed keys and additional functions on a keyboard, comprising:

signal generators for generating driving clocks and a signal SKIP after a key is pressed;

at least one row I/O port connected to said keys on said keyboard;

at least one column I/O port connected to said keys on said keyboard;

a key scanning circuit for scanning said pressed keys which can be disabled by said signal SKIP;

at least one external resistor connected to a source voltage;

at least one external resistor connected to a ground;

at least one switch capable of being set to connect said at least one row I/O port with one of said resistors or a float point which represent said functions;

at least one external resistor detecting circuit for connecting said at least one row I/O port to said source voltage or said ground at different clocks when said signal SKIP is at a high level; and a plurality of memory devices for storing statuses of said at least one row I/O port and said at least one column I/O port.

2. The keyboard scanning circuit for detecting pressed keys and additional functions on a keyboard of claim 1, wherein said signal generators comprises a clock generator for generating driving clocks and a signal generator which generates said signal SKIP.

3. The keyboard scanning circuit for detecting pressed keys and additional functions on a keyboard of claim 1, wherein said memory devices are latches.

4. A method for detecting additional functions on a keyboard which has at least one row port connected to a source voltage or a ground via a resistor or floating, comprising the following steps of:

(a) disabling a keyboard scanning circuit of the keyboard for a period of one scanning cycle;

(b) connecting said row port with a source voltage and then disconnecting said row port therefrom;

(c) storing a first status of said row port;

(d) connecting said row port with a ground and then disconnecting said row port therefrom;

(e) storing a second status of said row port; and (f) determining said additional functions by checking said first and second statuses stored in said steps (c) and (e).

5. The method for detecting additional functions on a keyboard of claim 4 wherein said steps (a) to (e) are performed when there is a bouncing noise on said keyboard.

* * * * *